(12) United States Patent
Usui

(10) Patent No.: US 8,462,316 B2
(45) Date of Patent: Jun. 11, 2013

(54) EXPOSURE APPARATUS, METHOD OF CONTROLLING THE SAME, AND DEVICE MANUFACTURING METHOD

(75) Inventor: Yoshiyuki Usui, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 573 days.

(21) Appl. No.: 12/613,421

(22) Filed: Nov. 5, 2009

(65) Prior Publication Data

US 2010/0110406 A1 May 6, 2010

(30) Foreign Application Priority Data

Nov. 6, 2008 (JP) .................................. 2008-285710

(51) Int. Cl.
*G03B 27/54* (2006.01)
*G03B 27/42* (2006.01)

(52) U.S. Cl.
USPC .............................................. 355/67; 355/53

(58) Field of Classification Search
USPC ...... 355/52, 53, 67–69; 250/548; 356/399–401
See application file for complete search history.

(56) References Cited

U.S. PATENT DOCUMENTS

| | | | |
|---|---|---|---|
| 6,078,380 A * | 6/2000 | Taniguchi et al. | 355/52 |
| 6,333,777 B1 | 12/2001 | Sato | |
| 6,522,386 B1 * | 2/2003 | Nishi | 355/52 |
| 6,721,039 B2 * | 4/2004 | Ozawa | 355/69 |
| 6,803,991 B2 * | 10/2004 | Mori | 355/53 |
| 6,894,764 B2 | 5/2005 | Shinoda | |
| 7,345,741 B2 | 3/2008 | Shiozawa et al. | |
| 7,864,296 B2 * | 1/2011 | Takahashi et al. | 355/71 |
| 2008/0143993 A1 | 6/2008 | Shiozawa et al. | |

FOREIGN PATENT DOCUMENTS

| | | |
|---|---|---|
| JP | 11-087232 A | 3/1999 |
| JP | 2003-318086 A | 11/2003 |
| JP | 2004-247527 A | 9/2004 |
| JP | 2006-019702 A | 1/2006 |

* cited by examiner

*Primary Examiner* — Hung Henry Nguyen
(74) *Attorney, Agent, or Firm* — Carter, DeLuca, Farrell & Schmidt LLP

(57) ABSTRACT

An apparatus which illuminates an original by an illumination optical system and projects a pattern of the original onto a substrate. The apparatus includes a measuring device configured to measure the light intensity distribution, a detector configured to detect a total light quantity on the pupil plane, and a controller configured to determine a light quantity, to be detected when a target light intensity distribution is formed on the pupil plane, as a target light quantity based on the measured light intensity distribution and the detected total light quantity, and to control the adjusting mechanism so that the detected total light quantity becomes the target light quantity. The illumination optical system includes an adjusting mechanism configured to adjust a light intensity distribution on a pupil plane of the projection optical system.

14 Claims, 7 Drawing Sheets

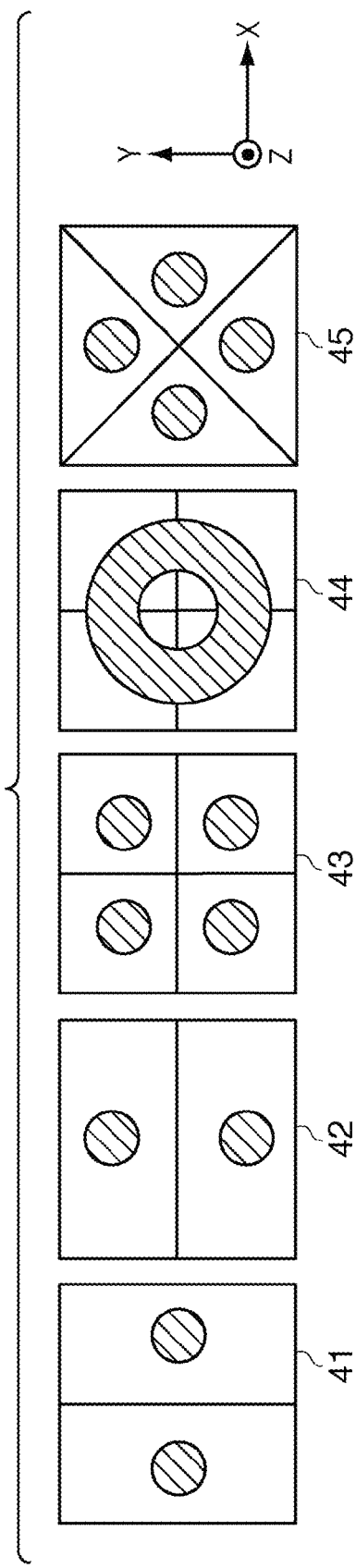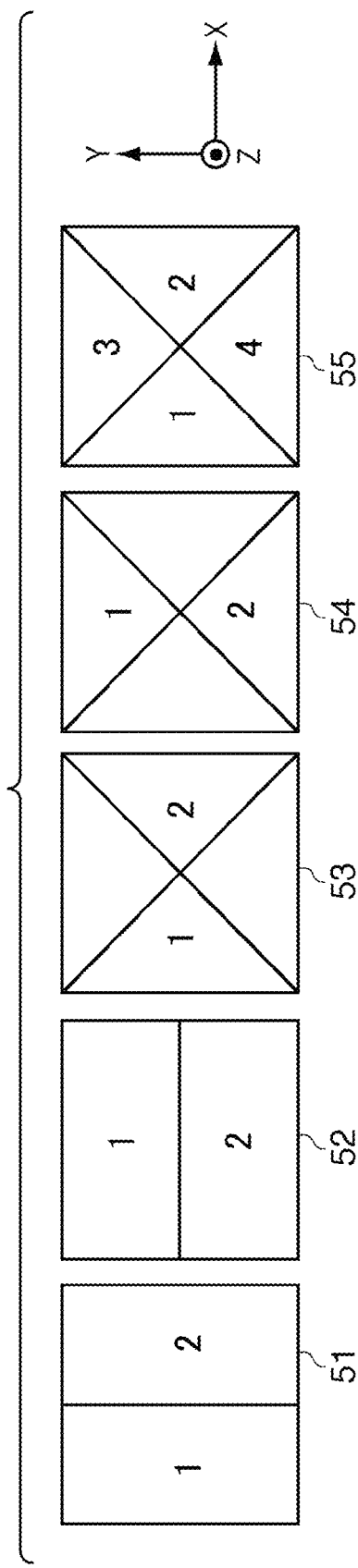

FIG. 5

| | |
|---|---|
| BEFORE ADJUSTMENT | TOTAL LIGHT QUANTITY:1000<br><br>6 (600) \| 4 (400) |
| TARGET LIGHT QUANTITY | 1000 × (4+4)/(6+4)=800 |
| ADJUSTING MEMBER TO BE DRIVEN | 122c ⟷ |
| AFTER ADJUSTMENT | TOTAL LIGHT QUANTITY:800<br><br>(400) \| (400) |

FIG. 6A
FIG. 6B
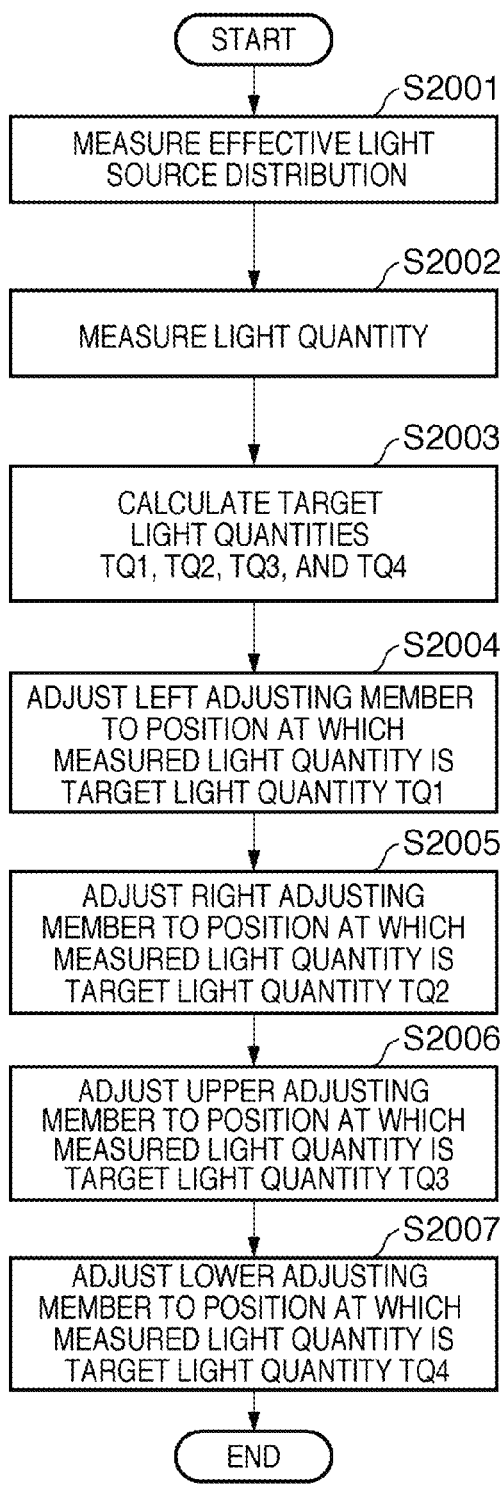
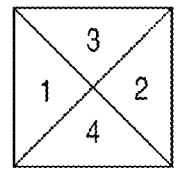
EFFECTIVE LIGHT SOURCE DISTRIBUTION
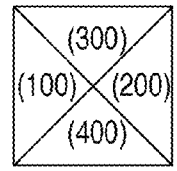
TOTAL LIGHT QUANTITY:1000
TARGET LIGHT QUANTITY TQ1=1000
TARGET LIGHT QUANTITY TQ2=900
TARGET LIGHT QUANTITY TQ3=700
TARGET LIGHT QUANTITY TQ4=400
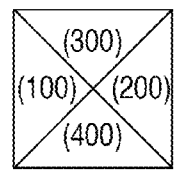
TOTAL LIGHT QUANTITY:1000
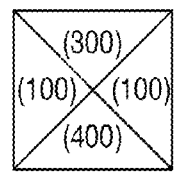
TOTAL LIGHT QUANTITY:900
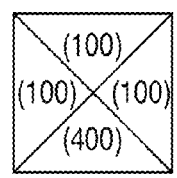
TOTAL LIGHT QUANTITY:700
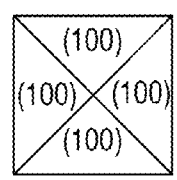
TOTAL LIGHT QUANTITY:400

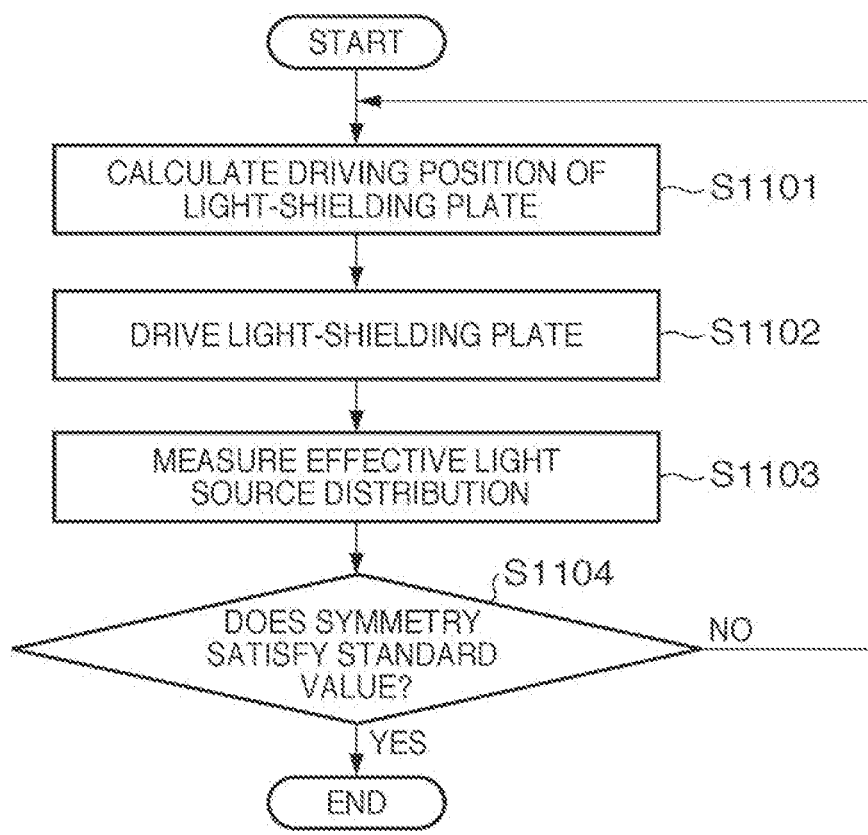

EXPOSURE APPARATUS, METHOD OF CONTROLLING THE SAME, AND DEVICE MANUFACTURING METHOD

BACKGROUND OF THE INVENTION

1. Field of the Invention

The present invention relates to an exposure apparatus which illuminates an original by an illumination optical system, and projects the pattern of the original onto a substrate, a method of controlling the same, and a method of manufacturing a device using the exposure apparatus.

2. Description of the Related Art

Modified illumination techniques are employed to miniaturize the patterns of semiconductor devices. These techniques use an optimum effective light source distribution in accordance with a pattern to be formed. The effective light source distribution means the light intensity distribution on the pupil plane of a projection optical system when an object such as an original is not located on the object plane, and can also be interpreted as the angle distribution of a light beam which strikes a substrate. The effective light source distribution can be controlled by adjusting the light intensity distribution on the pupil plane (e.g., in the vicinity of the exit plane of a fly-eye lens) corresponding to the Fourier transform plane of the plane (object plane) on which an original (also called a reticle or a mask) is located in an illumination optical system. Examples of the modified illuminations are annular illumination, quadrupole illumination, and dipole illumination (Japanese Patent Laid-Open Nos. 11-87232 and 2003-318086).

Attention is focused on the influence that the symmetry of the effective light source distribution exerts on an image formed on the image plane of a projection optical system. Conceivable examples of factors that deteriorate the symmetry of the effective light source distribution are a manufacturing error of an optical element, and a change in light intensity distribution upon reflecting polarized light by a mirror. To improve the symmetry of the effective light source distribution, one proposed method is to adjust the positions of a plurality of independently drivable light-shielding plates in a plane perpendicular to the optical axis of the projection optical system while measuring the effective light source distribution (Japanese Patent Laid-Open Nos. 2004-247527 and 2006-19702).

Along with the recent advances in micropatterning of semiconductor devices, a demand for the symmetry of the effective light source distribution has become stricter. Under the circumstance, in a process of adjusting the symmetry of the effective light source distribution by driving the light-shielding plate, a targeted symmetry can rarely be obtained upon only one light-shielding plate driving. Gradually bringing the light-shielding plate to an optimum position by repeating light-shielding plate driving and effective light source distribution measurement many times is generally performed.

FIG. 7 is a flowchart showing a sequence of adjusting the symmetry of the effective light source distribution in a conventional method. In step S1101, the target position of the light-shielding plate is calculated. In step S1102, the light-shielding plate is driven to the calculated target position. In step S1103, the effective light source distribution is measured. In step S1104, the symmetry of the effective light source distribution is checked based on the measurement result of the effective light source. If the symmetry satisfies a standard value, the symmetry adjustment by driving the light-shielding plate ends. On the other hand, if the symmetry does not satisfy the standard value, the process returns to step S1101.

As described above, in the conventional sequence of adjusting the symmetry of the effective light source distribution by the light-shielding plate, effective light source distribution measurement and light-shielding plate driving based on the measurement result are performed many times, thus taking a long time. Note that one effective light source distribution measurement includes a process of sensing, by an image sensor built in a measuring device mounted on a substrate stage, an image formed on the image sensing plane of the image sensor, and converting the sensed image into an image on the pupil plane of the projection optical system.

The foregoing discussion is concerned with an improvement in symmetry of the effective light source distribution. However, the measurement time also is to be shortened when the effective light source distribution is controlled to a target effective light source distribution.

SUMMARY OF THE INVENTION

One of the aspects of the present invention provides an apparatus which illuminates an original by an illumination optical system, and projects a pattern of the original onto a substrate by a projection optical system, the illumination optical system including an adjusting mechanism configured to adjust a light intensity distribution on a pupil plane of the projection optical system, the apparatus comprising a measuring device configured to measure the light intensity distribution, a detector configured to detect a total light quantity on the pupil plane, and a controller configured to determine a light quantity, to be detected by the detector when a target light intensity distribution is formed on the pupil plane, as a target light quantity based on the measured light intensity distribution and the detected total light quantity, and to control the adjusting mechanism so that the detected total light quantity becomes the target light quantity.

Further features of the present invention will become apparent from the following description of exemplary embodiments with reference to the attached drawings.

BRIEF DESCRIPTION OF THE DRAWINGS

FIG. 4A is a view illustrating illumination modes (the types of effective light source distribution);

FIG. 4B is a view illustrating evaluation region maps;

FIG. 5 is a table showing an example of effective light source distribution adjustment;

FIGS. 6A and 6B show a flowchart of a method of adjusting the effective light source distribution in "X- and Y-direction quadrupole cross pole illumination"; and FIG. 7 is a flowchart showing a sequence of adjusting the symmetry of the effective light source distribution in a conventional method.

DESCRIPTION OF THE EMBODIMENTS

Figure 2:
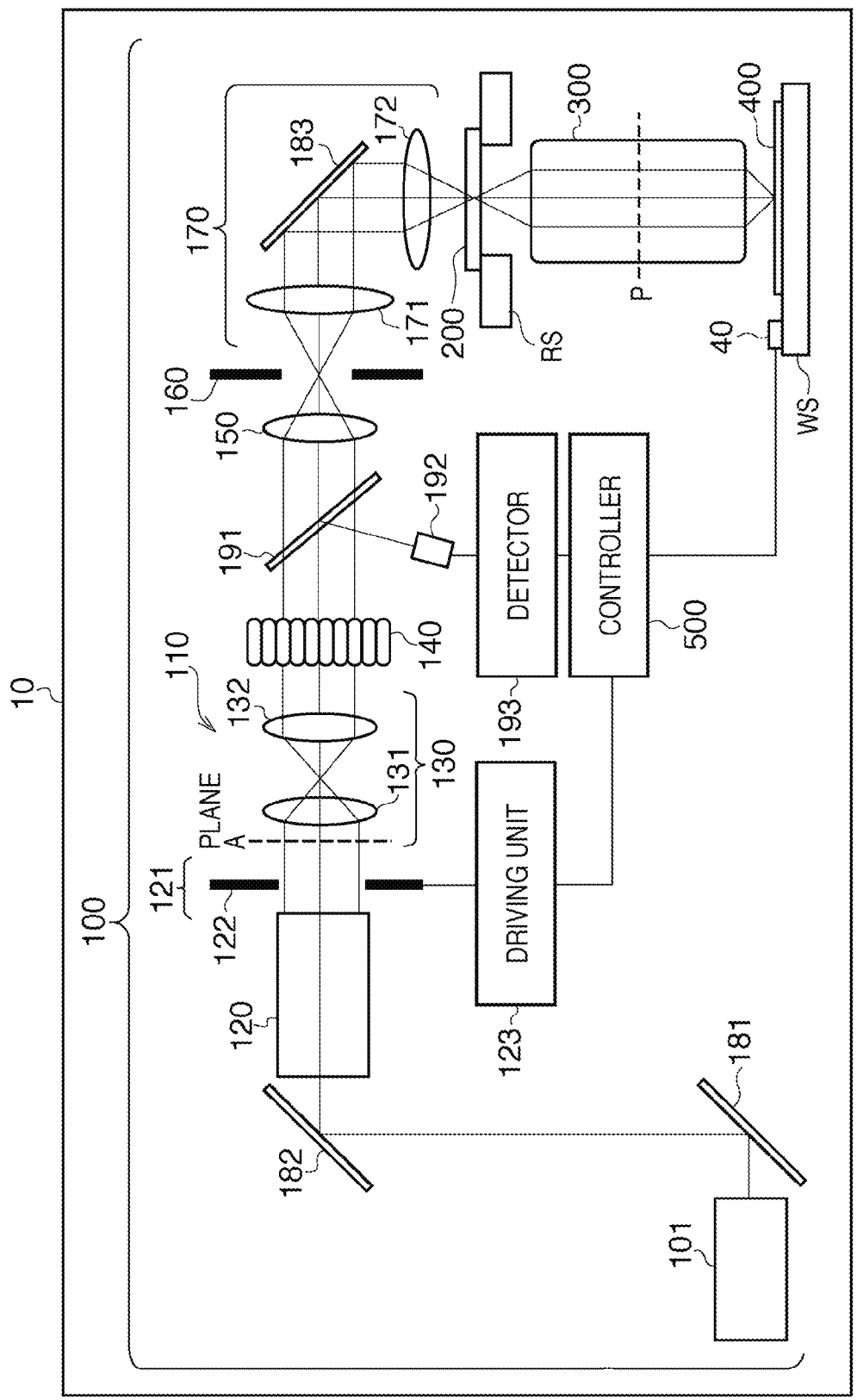
FIG. 2 is a view showing the schematic arrangement of an exposure apparatus according to an embodiment of the present invention.

FIG. 2 is a view showing the schematic arrangement of an exposure apparatus according to an embodiment of the present invention. An exposure apparatus 10 according to an embodiment of the present invention includes an illumination system 100, an original stage RS which holds an original 200, a projection optical system 300, a substrate stage WS which holds a substrate 400, and a controller 500. The exposure apparatus 10 can be of, for example, the step & scan scheme or the step & repeat scheme. The former exposure apparatus is called a scanner (scanning exposure apparatus), and the latter exposure apparatus is called a stepper.

The illumination system 100 includes a light source unit 101, and an illumination optical system 110 which illuminates the original 200 with light supplied from a light source. The pattern of the illuminated original 200 is projected onto the substrate 400 by the projection optical system 300. With this operation, the substrate 400 is exposed to form a latent image on a photosensitive agent applied on the substrate 400.

As the light source, the light source unit 101 can include an excimer laser such as an ArF excimer laser which oscillates light having a wavelength of about 193 nm, or a KrF excimer laser which oscillates light having a wavelength of about 248 nm. The type of light source is not limited to an excimer laser. For example, the light source unit 101 may use another light source such as a mercury lamp or a xenon lamp. The number of light sources is not limited to one, either. When the light source unit 101 uses a laser as the light source, it may include an incoherent optical system which converts coherent light generated by the laser into incoherent light.

The illumination optical system 110 can include, for example, a lens, mirror, optical integrator, and stop. The illumination optical system 110 can also include a light beam shape converter 120, imaging optical system 130, fly-eye lens 140, condensing optical system 150, half mirror 191, light quantity sensor 192, detector 193, masking blade 160, imaging optical system 170, and deflecting mirrors 181 to 183.

The deflecting mirrors 181 and 182 guide a light beam emitted by the light source unit 101 to the light beam shape converter 120. The light beam shape converter 120 converts the shape of a light beam supplied from the light source unit 101 into a given shape in accordance with the illumination mode to form a light intensity distribution corresponding to the illumination mode on a Fourier transform plane (the Fourier transform plane of the object plane of the projection optical system 300) A. The illumination optical system 110 includes an adjusting mechanism 121. The adjusting mechanism 121 adjusts the light intensity distribution formed on the Fourier transform plane A by the light beam shape converter 120 to, in turn, adjust the light intensity distribution on a pupil plane P of the projection optical system 300.

The light intensity distribution formed on the Fourier transform plane A is projected onto the incident surface of the fly-eye lens 140 at the magnification of the imaging optical system 130 by the imaging optical system 130 including lenses 131 and 132. An image is formed on the pupil plane P of the projection optical system 300 by a large number of secondary light sources formed on the exit plane of the fly-eye lens 140. The formed image is the effective light source distribution.

The light emerging from the fly-eye lens 140 illuminates the plane, on which the masking blade 160 is located, upon passing through the condensing optical system 150. The masking blade 160 is placed at a position optically conjugate to the plane, on which the original 200 is located, by the imaging optical system 170 including lenses 171 and 172, and determines the illumination region on the surface of the original 200. The light having passed through the original 200 strikes the substrate 400 via the projection optical system 300.

The detector 193 detects the total light quantity in the effective light source distribution (the light intensity distribution on the pupil plane P) based on the output value from the light quantity sensor 192 inserted in the illumination optical system 110. The half mirror 191 is interposed between the fly-eye lens 140 and the condensing optical system 150. The half mirror 191 partially splits the light from the optical path to illuminate the original 200, and supplies the extracted light to the light quantity sensor 192. The light quantity sensor 192 measures the total light quantity of light that has passed through the entire region of the pupil plane (the exit plane of the fly-eye lens 140) of the fly-eye lens 140 in the illumination system 100 and that has been reflected by the half mirror 191. Note that the detector 193 can undergo calibration of a coefficient, for converting the output value from the light quantity sensor 192 into the total light quantity of the effective light source distribution, periodically or according to a given plan. Information representing the total light quantity detected by the detector 193 is provided to the controller 500.

In another embodiment, the detector 193 can detect the total light quantity of the effective light source distribution based on the light intensity distribution measured by a measuring device 40. This detection can be done by calculating the sum total of the pixel values in the sensed image of the light intensity distribution, and multiplying the calculated sum total by the coefficient.

The measuring device 40 is mounted on the substrate stage WS, and measures the light intensity distribution on the pupil plane of the projection optical system 300. In measuring the effective light source distribution, the original 200 is removed from the optical path. The measuring device 40 can include, for example, a light-shielding member having a pinhole formed in it, and an image sensor (two-dimensional photoelectric converter array) which senses an image formed by the light having passed through the pinhole. The image sensor is spaced apart from the light-shielding member by a predetermined distance. The predetermined distance is that at which an image formed by the light having passed through the pinhole at an angle corresponding to the position on the pupil plane P can be sensed at a resolution. Note that the substrate stage WS may be positioned at a plurality of positions (a plurality of image heights) in a horizontal plane, and the measuring device 40 may measure the light intensity distribution on the pupil plane P at each position. Information representing the light intensity distribution obtained by the measuring device 40 is provided to the controller 500.

Typically, the image which is sensed by the image sensor of the measuring device 40 and remains intact does not conform to a light intensity distribution in the coordinate system defined in the pupil plane P. For this reason, that image can be converted into a light intensity distribution in the coordinate system defined in the pupil plane P. The controller 500, the measuring device 40, or an arithmetic processor (not shown) may perform this conversion. This conversion consumes a considerable arithmetic processing time, so repetition of effective light source distribution measurement which uses the measuring device 40 naturally prolongs the time taken to adjust the effective light source distribution, as described above. Effective light source distribution measurement at different image heights also prolongs the time taken to adjust the effective light source distribution. Therefore, the number of times of effective light source distribution measurement which uses the measuring device 40 is to be minimized (e.g., one time).

In adjusting the effective light source distribution, the controller 500 determines whether the effective light source distribution is a target effective light source distribution (target light intensity distribution) and, typically, has a symmetry that satisfies a target performance. The controller 500 uses an evaluation region map corresponding to the illumination mode in this determination. The evaluation region map is a map representing the arrangement of a plurality of evaluation regions. Based on the ratio between the quantities of light beams which respectively enter the plurality of evaluation regions represented by the evaluation region map, the controller 500 determines whether the effective light source distribution is a target effective light source distribution and, typically, has a symmetry that satisfies a target performance. The evaluation region means herein a partial region on the pupil plane P of the projection optical system 300. The evaluation region is therefore equivalent to a part of the image sensing region on the image sensor built in the measuring device 40.

FIG. 4A is a view illustrating illumination modes (the types of effective light source distribution). Reference numeral 41 denotes "dipole X illumination"; 42, "dipole Y illumination"; 43, "X- and Y-direction quadrupole cross pole illumination"; 44, annular illumination; and 45, "45°-direction quadrupole illumination". Note that an X-Y-Z coordinate system is defined such that a plane parallel to the surface of the substrate 400 is the X-Y plane. The Z-axis (Z direction) is defined parallel to the optical axis of the projection optical system 300.

FIG. 4B is a view illustrating evaluation region maps. Referring to FIG. 4B, regions "1", "2", "3", and "4" mean evaluation regions. If the illumination mode is the "dipole X illumination" 41, an evaluation region map 51 can be used. If the illumination mode is the "dipole Y illumination" 42, an evaluation region map 52 can be used. If the illumination mode is the "45°-direction quadrupole illumination" 45 and the annular illumination 44, the evaluation region map 51 can be used to check symmetry in the X direction, and the evaluation region map 52 can be used to check symmetry in the Y direction. The symmetry in the X direction means herein symmetry about the Y-axis, and the symmetry in the Y direction means herein symmetry about the X-axis.

If the illumination mode is the "X- and Y-direction quadrupole cross pole illumination" 43, an evaluation region map 53 is used to check symmetry in the X direction, and an evaluation region map 54 is used to check symmetry in the Y direction. Again, if the illumination mode is the "X- and Y-direction quadrupole cross pole illumination" 43, an evaluation region map 55 may be used to simultaneously check symmetries in the X and Y directions.

For example, a case in which whether the symmetry of the effective light source distribution satisfies a target performance is determined using the evaluation region map 51 will be considered. In this case, the controller 500 can determine that the symmetry of the effective light source distribution satisfies a target performance when the ratio between the quantities of light beams which respectively enter evaluation regions 1 and 2 is 1:1+Δ (Δ is the value determined depending on the target performance).

Figure 3A:
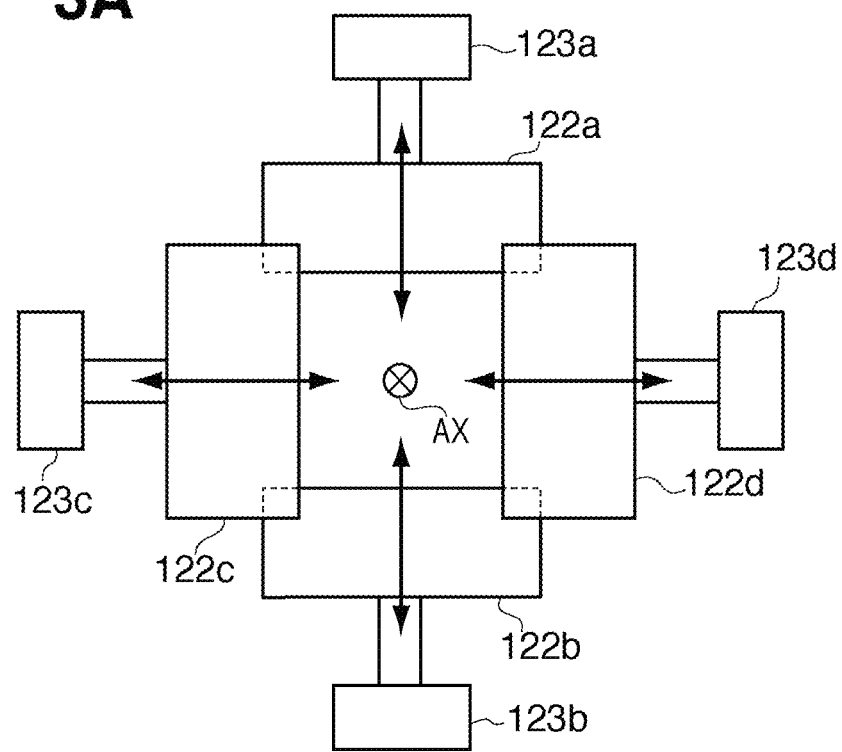
FIG. 3A is a view illustrating an adjusting mechanism which adjusts the effective light source distribution.
Figure 3B:
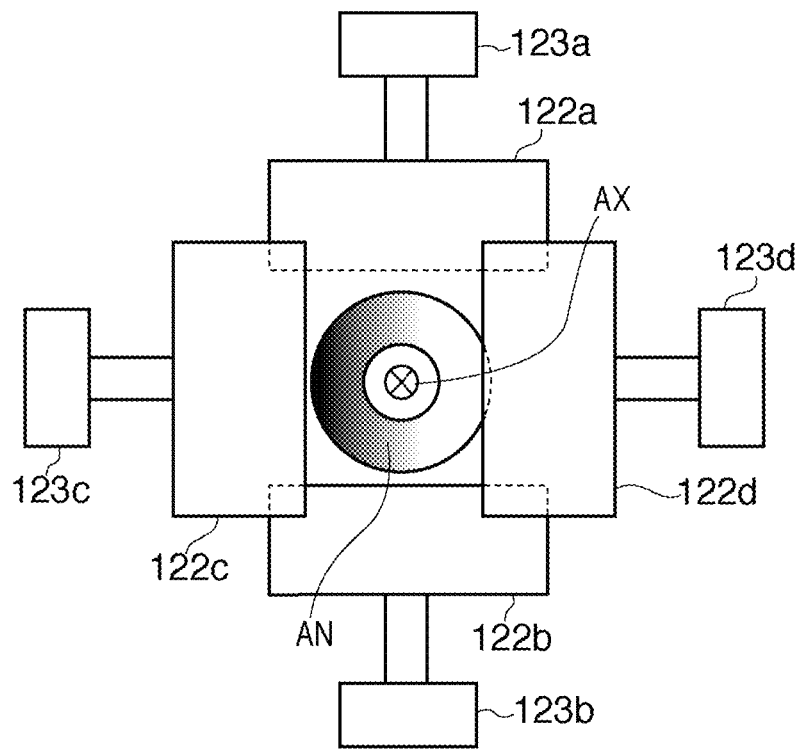
FIG. 3B is a view illustrating the adjusting mechanism which adjusts the effective light source distribution.

The adjusting mechanism 121 which adjusts the effective light source distribution, i.e., the light intensity distribution on the pupil plane P of the projection optical system 300 will be explained with reference to FIGS. 3A and 3B. Referring to FIGS. 3A and 3B, reference symbol AX denotes the optical axis of the illumination optical system 110. The adjusting mechanism 121 includes, for example, a plurality of adjusting members 122a, 122b, 122c, and 122d (shown as an adjusting member 122 in FIG. 2), and a plurality of driving units 123a, 123b, 123c, and 123d which independently drive the plurality of adjusting members 122a, 122b, 122c, and 122d, respectively. The plurality of adjusting members 122a to 122d are interposed between the light beam shape converter 120 and the fly-eye lens 140. The controller 500 controls the plurality of driving units 123a to 123d to, in turn, control driving of the plurality of adjusting members 122a to 122d. Each of the plurality of adjusting members 122a, 122b, 122c, and 122d is a member having a light transmittance of 0% or less than 100% (e.g., several percent).

The plurality of driving units 123a to 123d drive the plurality of adjusting members 122a to 122d in a direction closer to the optical axis AX of the illumination optical system 110 and in a direction away from the optical axis AX of the illumination optical system 110. When the plurality of adjusting members 122a to 122d are driven in a direction closer to the optical axis AX of the illumination optical system 110, the light beam emerging from the light beam shape converter 120 is partially shielded or attenuated.

FIG. 3B is a view schematically showing a mechanism of lowering the right light intensity of a light intensity distribution AN in annular illumination by driving the right adjusting member 122d toward the optical axis AX. FIG. 3B schematically shows that a darker tone level in gradation expressing the light intensity distribution AN indicates a lower light intensity, and a lighter tone level in this gradation indicates a higher light intensity. The symmetry of the effective light source distribution can be improved by partially shielding or attenuating a part of a portion having a relatively high light intensity by the corresponding adjusting member 122d. FIG. 3B depicts the light intensity distribution AN in annular illumination as if it had a local loss. However, the adjusting member 122 including the adjusting members 122a to 122d is disposed at a position spaced apart from the Fourier transform plane A of the illumination optical system 110. Hence, an effective light source distribution formed actually has a locally low light intensity while maintaining the contour of the light intensity distribution AN (see Japanese Patent Laid-Open No. 2006-19702).

Figure 1:
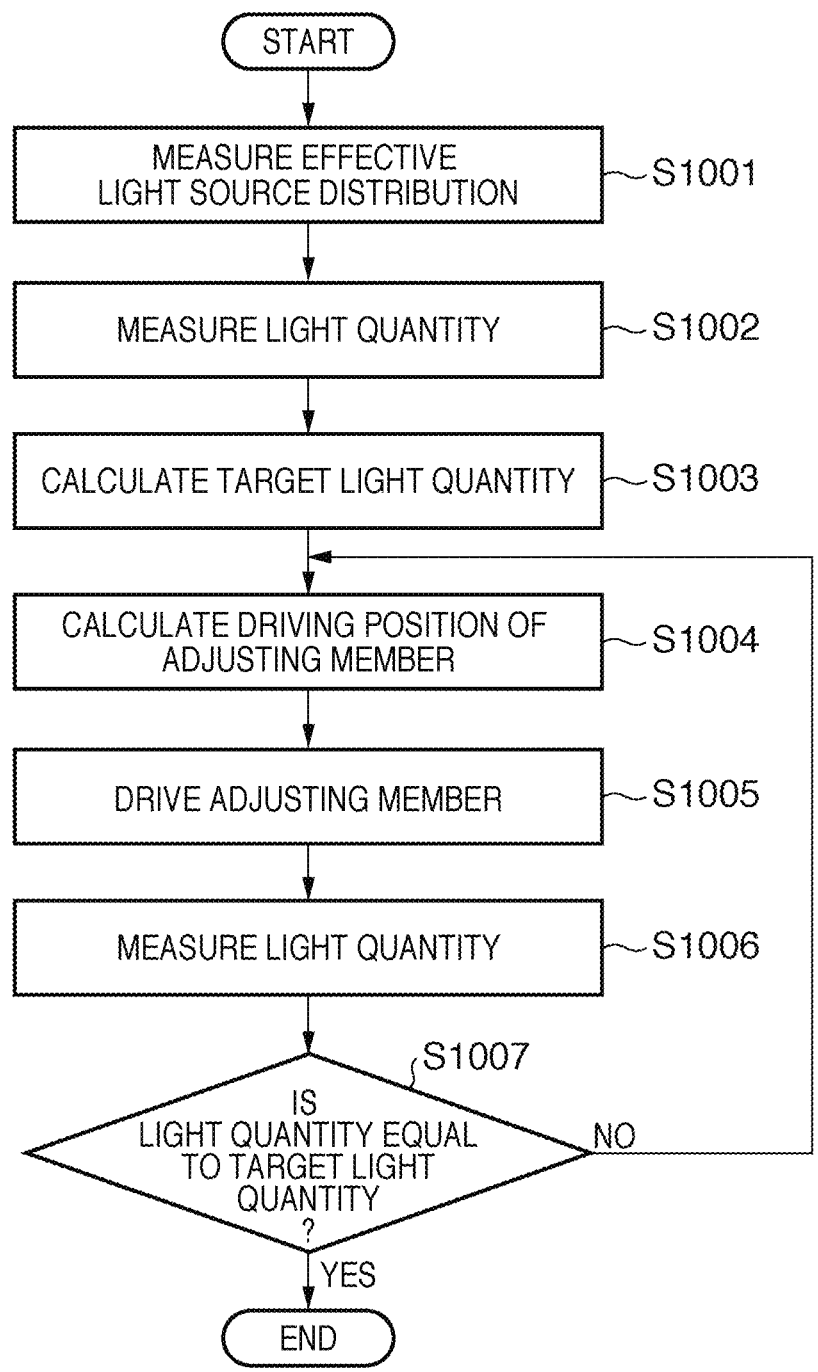
FIG. 1 is a flowchart showing a method of adjusting the effective light source distribution according to an embodiment of the present invention.

FIG. 1 is a flowchart showing a method of adjusting the effective light source distribution according to an embodiment of the present invention. The controller 500 controls the process shown in this flowchart. A method of adjusting the effective light source distribution so that the symmetry of the effective light source distribution satisfies a target performance will be explained herein. However, this method is also applicable to adjustment of the effective light source distribution to a target effective light source distribution. Adjusting the effective light source distribution so that its symmetry satisfies a target performance amounts to adjusting it by setting an effective light source distribution having a symmetry that satisfies a target performance as the target effective light source distribution.

In step S1001, the controller 500 measures the effective light source distribution using the measuring device 40. Also, the controller 500 calculates a ratio (R1:R2) between the quantities of light beams which respectively enter evaluation regions 1 and 2.

In step S1002 (measure light quantity), the controller 500 causes the detector 193 to detect a total light quantity T on the pupil plane P of the projection optical system 300. The detector 193 may detect the total light quantity T on the pupil plane P of the projection optical system 300 based on the output value from the light quantity sensor 192, as described above, or based on the light intensity distribution measured using the measuring device 40. Steps S1001 and S1002 may be executed in reverse order from the above-mentioned order or may be executed at once in one light irradiation by the light source unit 101.

In step S1003 (calculate target light quantity), the controller 500 determines a target light quantity TQ based on the ratio (R1:R2) between the light quantities in evaluation regions 1 and 2, which is calculated in step S1001, and the total light quantity T detected in step S1002. The target light quantity TQ mentioned herein is the total light quantity to be detected by the detector 193 when a target effective light source distribution (target light intensity distribution) is formed on the pupil plane P. The process in step S1003 will be explained in detail herein by taking, as an example, adjustment of symmetry in the X direction (symmetry about the Y-axis) using the evaluation region map 51 shown in FIG. 4B. In this embodiment, the target light quantity is determined, and an adjusting member to be driven of the plurality of adjusting members 122a to 122d is specified.

Using the ratio (R1:R2) calculated in step S1001, and the light quantity T detected in step S1002, the target light quantity TQ can be given by:

<Target Light Quantity> when $R1 > R2: TQ = T \times (R2+R2)/(R1+R2)$ when $R1 < R2: TQ = T \times (R1+R1)/(R1+R2)$ Also, the adjusting member to be driven is as follows:
<Adjusting Member to be Driven>
when R1>R2: R1-side adjusting member 122c
when R1<R2: R2-side adjusting member 122d In step S1004 (calculate driving position of adjusting member), the controller 500 determines the driving position of the adjusting member to be driven. This determination can adopt various kinds of methods. For example, this determination can adopt a method of adding or subtracting a value corresponding to a predetermined driving pitch to or from the current value of the adjusting member. Alternatively, this determination may adopt a method of driving the adjusting member to a plurality of positions, measuring the total light quantities at these positions, and approximating the relationship between the total light quantity and the position of the adjusting member by a function, thereby determining the driving position of the adjusting member based on the obtained function.

In step S1005 (drive adjusting member), the controller 500 controls a corresponding driving unit of the plurality of driving units 123a to 123d so as to drive the adjusting member determined in step S1003 to the driving position determined in step S1004.

In step S1006 (measure light quantity), the controller 500 causes the detector 193 to detect the total quantity of light which reaches the image plane of the projection optical system 300 (the scalar light quantity of the entire effective light source).

In step S1007, the controller 500 determines whether the total light quantity detected in step S1006 is equal to the target light quantity TQ determined in step S1003. If the total light quantity is equal to the target light quantity TQ, the adjusting process ends; otherwise, steps S1004 to S1007 are repeated. As described above, the control time can be shortened by controlling the effective light source distribution by setting the total light quantity as the target value.

FIG. 5 is a table showing an example of effective light source distribution adjustment. Referring to FIG. 5, the column of "Before Adjustment" indicates the light quantities in evaluation regions 1 and 2 and the total light quantity detected by the detector 193, before adjusting the symmetry of the effective light source distribution. The column of "Target Light Quantity" indicates an example of calculation of the target light quantity TQ. The column of "Adjusting Member to be Driven" indicates that the adjusting member to be driven for symmetry adjustment is the adjusting member 122c. The column of "After Adjustment" indicates the light quantities in evaluation regions 1 and 2 and the total light quantity detected by the detector 193, after adjusting the symmetry of the effective light source distribution.

In the example shown in FIG. 5, the illumination mode is the "dipole X illumination" 41, and the evaluation region map 51 is used. The ratio (R1:R2) between the left and right light quantities of the effective light source distribution before adjustment is 6:4, and the total light quantity T is 1000 (unit: none).

In, for example, step S1003, the ratio between the light quantity in the left region (evaluation region 1) and that in the right region (evaluation region 2) is calculated as 6:4 based on the effective light source distribution measured in step S1001. In step S1002, the detector 193 detects the total light quantity T as 1000.

A light quantity QL (unit: none), in the left region (evaluation region 1), of the total light quantity T can be calculated by:

$$QL = T \times R1 / (R1 + R2)$$
$$= 1000 \times 6 / (6 + 4)$$
$$= 600$$

A light quantity QR (unit: none), in the right region (evaluation region 2), of the total light quantity T can be calculated by:

$$QR = T \times R2 / (R1 + R2)$$
$$= 1000 \times 4 / (4 + 6)$$
$$= 400$$

A target light quantity TQ (unit: none) as the overall light quantity after completing the adjustment is calculated in step S1003 by:

$$TQ = (R2 + R2) / (R1 + R2)$$
$$= 1000 \times (4 + 4) / (6 + 4)$$
$$= 800$$

The adjusting member to be driven is the left adjusting member 122c. Adjustment of the adjusting member (i.e., effective light source distribution adjustment) is completed by repeating steps S1004, S1005, S1006, and S1007. In this example, the adjustment is completed when the difference between the target light quantity TQ and the total light quantity detected in step S1006 falls within a tolerance.

At the stage of completing the adjustment, the light quantity in the left region becomes a value (400) decremented by 200 (=600−400) from the initial value (600) by the adjusting member, i.e., equals the light quantity (400) in the right region. In other words, the light quantities in both the left and right regions become 400 upon adjusting the effective light source distribution, thus obtaining an effective light source distribution having a symmetry controlled to fall within a tolerance.

Although the ratio between the light quantities in the left and right regions (the same applies to the upper and lower regions) of the effective light source distribution is adjusted to 1:1 in the above-mentioned example, it can be set arbitrarily. Let R1:R2 be the ratio between the quantities of light beams which respectively enter evaluation regions 1 and 2 in the initial state (before adjustment), and T be the total light quantity of the entire effective light source detected by the detector 193. When the ratio between the light quantities in evaluation regions 1 and 2 of the effective light source distribution is adjusted to W1:W2, in step S1003 the target light quantity TQ is only be calculated in accordance with:

<Target Light Quantity> when $R1/W1 > R2/W2 : TQ = T \times (R2/W2 \times W1 + R2)/(R1+R2)$ when $R1/W1 < R2/W2 : TQ = T \times (R1/W1 \times W2 + R1)/(R1+R2)$ Also, the adjusting member to be driven is as follows:
<Adjusting Member to be Driven>
when R1/W1>R2/W2: R1-side adjusting member 122c
when R1/W1<R2/W2: R2-side adjusting member 122d

A method of adjusting the effective light source distribution when the illumination mode is the "X- and Y-direction quadrupole cross pole illumination" 43 will be explained below as another concrete example. In this case, the evaluation region map 55 is used. More specifically, a method of adjusting not only symmetry in the X direction (symmetry about the Y-axis) and symmetry in the Y direction (symmetry about the X-axis), but also the difference in light intensity (H/V difference) between the X and Y directions will be explained herein.

FIG. 6A is a flowchart showing a method of adjusting the effective light source distribution in "X- and Y-direction quadrupole cross pole illumination". The controller 500 controls the process shown in this flowchart. The light quantities in evaluation regions 1, 2, 3, and 4 are assumed herein to be adjusted to have a ratio W1:W2:W3:W4.

In step S2001, the controller 500 measures the effective light source distribution using the measuring device 40. Also, the controller 500 calculates a ratio R1:R2:R3:R4 among the quantities of light beams which respectively enter evaluation regions 1, 2, 3, and 4 in the evaluation region map 55.

In step S2002 (measure light quantity), the controller 500 causes the detector 193 to detect a total light quantity T on the pupil plane P of the projection optical system 300.

Based on the ratio R1:R2:R3:R4 calculated in step S2001, and the total light quantity T detected in step S2002, in step S2003 the controller 500 calculates target light quantities TQ1, TQ2, TQ3, and TQ4:

target light quantity $TQ1 = T \times (MIN \times W1 + R2 + R3 + R4)/(R1+R2+R3+R4)$ target light quantity $TQ2 = T \times (MIN \times W1 + MIN \times W2 + R3 + R4)/(R1+R2+R3+R4)$ target light quantity $TQ3 = T \times (MIN \times W1 + MIN \times W2 + MIN \times W3 + R4)/(R1+R2+R3+R4)$ target light quantity $TQ4 = T \times (MIN \times W1 + MIN \times W2 + MIN \times W3 + MIN \times W4)/(R1+R2+R3+R4)$ where MIN is the minimum one of R1/W1, R2/W2, R3/W3, and R4/W4.

In step S2004, the controller 500 instructs the driving unit 123c to drive the adjusting member 122c to the position at which the light quantity detected by the detector 193 is the target light quantity TQ1.

In step S2005, the controller 500 instructs the driving unit 123d to drive the adjusting member 122d to the position at which the light quantity detected by the detector 193 is the target light quantity TQ2.

In step S2006, the controller 500 instructs the driving unit 123a to drive the adjusting member 122a to the position at which the light quantity detected by the detector 193 is the target light quantity TQ3.

In step S2007, the controller 500 instructs the driving unit 123b to drive the adjusting member 122b to the position at which the light quantity detected by the detector 193 is the target light quantity TQ4.

FIG. 6B shows information on the effective light source distribution in each step of the sequence shown in FIG. 6A. That information represents simulation values. Assume that R1:R2:R3:R4=1:2:3:4 and T=1000 in the initial state (before adjustment). Assume also that the targeted light quantity ratio is W1:W2:W3:W4=1:1:1:1.

A light quantity QL, in the left region (evaluation region 1), of the total light quantity T can be calculated by:

$$QL = T \times R1/(R1 + R2 + R3 + R4)$$
$$= 1000 \times 1/(1 + 2 + 3 + 4)$$
$$= 100$$

A light quantity QR, in the right region (evaluation region 2), of the total light quantity T can be calculated by:

$$QR = T \times R2/(R1 + R2 + R3 + R4)$$
$$= 1000 \times 2/(1 + 2 + 3 + 4)$$
$$= 200$$

A light quantity QT, in the upper region (evaluation region 3), of the total light quantity T can be calculated by:

$$QT = T \times R3/(R1 + R2 + R3 + R4)$$
$$= 1000 \times 3/(1 + 2 + 3 + 4)$$
$$= 300$$

A light quantity QB, in the lower region (evaluation region 4), of the total light quantity T can be calculated by:

$$QB = T \times R4/(R1 + R2 + R3 + R4)$$
$$= 1000 \times 4/(1 + 2 + 3 + 4)$$
$$= 400$$

The target light quantities TQ1, TQ2, TQ3, and TQ4 calculated in step S2003 are given by:

MIN=MIN(1/1,2/1,3/1,4/1)=1

$TQ1 = 1000 \times (1 \times 1 + 2 + 3 + 4)/(1+2+3+4) = 1000$ $TQ2 = 1000 \times (1 \times 1 + 1 \times 1 + 3 + 4)/(1+2+3+4) = 900$ $TQ3 = 1000 \times (1 \times 1 + 1 \times 1 + 1 \times 1 + 4)/(1+2+3+4) = 700$ $TQ4 = 1000 \times (1 \times 1 + 1 \times 1 + 1 \times 1 + 1 \times 1)/(1+2+3+4) = 400$ In step S2004, the left adjusting member 122c is controlled to the position at which the total light quantity detected by the detector 193 is 1000. Note, however, that in this example, both the total light quantity T in the initial state and the target light quantity TQ1 are 1000, and this means that there is no need to drive the adjusting member 122c. Therefore, the light quantity in the left region (evaluation region 1) remains 100 as in the initial state, after the end of step S2004.

In step S2005, the right adjusting member 122d is driven to the position at which the total light quantity detected by the detector 193 is 900. The right adjusting member 122d adjusts the light quantity in the right region (evaluation region 2) to be decremented by 100 (=1000−900). Therefore, the light quantity in the right region (evaluation region 2) changes to 100 (=200−100) after the end of step S2005.

In step S2006, the upper adjusting member 122a is driven to the position at which the total light quantity detected by the detector 193 is 700. The upper adjusting member 122a adjusts the light quantity in the upper region (evaluation region 3) to be decremented by 200 (=900−700). Therefore, the light quantity in the upper region (evaluation region 3) changes to 100 (=300−200) after the end of step S2006.

In step S2007, the lower adjusting member 122b is driven to the position at which the total light quantity detected by the detector 193 is 400. The lower adjusting member 122b adjusts the light quantity in the lower region (evaluation region 4) to be decremented by 300 (=700−400). Hence, the light quantity in the lower region (evaluation region 4) changes to 100 (=400−300) after the end of step S2007.

After the end of step S2007, the light quantities in evaluation regions 1, 2, 3, and 4 change to satisfy 100:100:100:100=1:1:1:1, that is equal to the targeted light quantity ratio.

Although four adjusting members adjust the effective light source distribution in the above-mentioned embodiments, an arbitrary number n of adjusting members can be used. The number of evaluation regions in an evaluation region map can be equal to but may be different from that of adjusting members.

The first-stage adjustment may be performed in the sequence shown in FIG. 1 or 6A, and thereafter the second-stage adjustment may be performed in the sequence shown in FIG. 7. In this case, the effective light source distribution can be finely adjusted by the second-stage adjustment after being coarsely adjusted by the first-stage adjustment. This makes it possible to shorten the overall adjustment time as compared with a case in which all types of adjustment are performed in the sequence shown in FIG. 7.

A device manufacturing method according to one embodiment of the present invention can be used to manufacture devices such as a semiconductor device and a liquid crystal display device. The device manufacturing method according to the embodiment of the present invention includes a step of adjusting an exposure apparatus so as to form a target light intensity distribution on the pupil plane of a projection optical system in the exposure apparatus in accordance with the above-mentioned adjusting method, a step of exposing a substrate by the exposure apparatus, and a step of developing the substrate. The device manufacturing method can also include known subsequent steps (e.g., oxidation, film formation, vapor deposition, doping, planarization, etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-285710, filed Nov. 6, 2008, which is hereby incorporated by reference herein in its entirety.

What is claimed is:

1. An apparatus which illuminates an original by an illumination optical system, and projects a pattern of the original onto a substrate by a projection optical system,
the illumination optical system including an adjusting mechanism configured to adjust a light intensity distribution on a pupil plane of the projection optical system,
the apparatus comprising:
a measuring device configured to measure a light intensity distribution that is formed on the pupil plane of the projection optical system,
a detector configured to detect a total light quantity on the pupil plane, and
a controller configured to determine a light quantity, to be detected by the detector when a target light intensity distribution is formed on the pupil plane, as a target light quantity based on the measured light intensity distribution and the detected total light quantity, and to control the adjusting mechanism so that the detected total light quantity becomes the target light quantity,
wherein the controller calculates light quantities of a plurality of evaluation regions on the pupil plane, based on the measured light intensity distribution, and determines the target light quantity based on the calculated light quantities of the plurality of evaluation regions and the detected total light quantity,
wherein the adjusting mechanism includes a plurality of adjusting members and a plurality of driving units configured to drive the plurality of adjusting members, wherein quantities of light beams which enter the plurality of evaluation regions are to be changed in accordance with the driving of the plurality of adjusting members, and
wherein the controller controls the plurality of driving units, based on the calculated light quantities of the plurality of evaluation regions, so that the detected total light quantity becomes the target light quantity.

2. The apparatus according to claim 1, wherein the controller calculates a ratio between the light quantities of the plurality of evaluation regions on the pupil plane, and determines the target light quantity, based on the calculated ratio, so that the target light intensity distribution is obtained when the target light quantity is achieved.

3. The apparatus according to claim 2, wherein the controller determines an adjusting member to be driven of the plurality of adjusting members to obtain the target light intensity distribution.

4. The apparatus according to claim 1, wherein the detector detects the total light quantity based on an output value from a light quantity sensor arranged in the illumination optical system.

5. The apparatus according to claim 1, wherein the detector detects the total light quantity based on the light intensity distribution measured by the measuring device.

6. The apparatus according to claim 1, wherein the measuring device is mounted on a substrate stage which holds a substrate.

7. A method comprising:
adjusting the apparatus defined in claim 1 so as to form the target light intensity distribution;
exposing the substrate; and
developing the substrate.

8. A method of controlling an apparatus which illuminates an original by an illumination optical system, and projects a pattern of the original onto a substrate by a projection optical system, thereby exposing the substrate, the illumination optical system including an adjusting mechanism configured to adjust a light intensity distribution on a pupil plane of the projection optical system, the apparatus including:
- a measuring device configured to measure a light intensity distribution that is formed on the pupil plane of the projection optical system, and
- a detector configured to detect a total light quantity on the pupil plane, the method comprising:
- calculating light quantities of a plurality of evaluation regions on the pupil plane, based on the measured light intensity distribution; and
- determining a light quantity, to be detected by the detector when a target light intensity distribution is formed on the pupil plane, as a target light quantity based on the calculated light quantities of the plurality of evaluation regions and the detected total light quantity; and
- controlling the adjusting mechanism so that the detected total light quantity becomes the target light quantity, wherein the adjusting mechanism includes a plurality of adjusting members and a plurality of driving units configured to drive the plurality of adjusting members, wherein quantities of light beams which enter the plurality of evaluation regions are to be changed in accordance with the driving of the plurality of adjusting members, and wherein controlling the adjusting mechanism includes controlling the plurality of driving units, based on the calculated light quantities of the plurality of evaluation regions, so that the detected total light quantity becomes the target light quantity.

9. A method comprising:

illuminating an original by an illumination optical system;

projecting a pattern of the original onto a substrate by a projection optical system;

adjusting a light intensity distribution on a pupil plane of the projection optical system by an adjusting mechanism of the illumination optical system;

measuring a light intensity distribution that is formed on the pupil plane of the projection optical system;

calculating light quantities of a plurality of evaluation regions on the pupil plane, based on the measured light intensity distribution;

detecting a total light quantity on the pupil plane;

determining a light quantity as a target light quantity based on the calculated light quantities of the plurality of evaluation regions and the detected total light quantity; and controlling the adjusting mechanism so that the detected total light quantity becomes the target light quantity, wherein the adjusting mechanism includes a plurality of adjusting members and a plurality of driving units configured to drive the plurality of adjusting members, wherein quantities of light beams which enter the plurality of evaluation regions are to be changed in accordance with the driving of the plurality of adjusting members, and wherein controlling of the adjusting mechanism includes controlling the plurality of driving units, based on the calculated light quantities of the plurality of evaluation regions, so that the detected total light quantity becomes the target light quantity.

10. The method according to claim 8, wherein determining the target light quantity includes calculating a ratio between the light quantities of the plurality of evaluation regions on the pupil plane, and determining the target light quantity, based on the calculated ratio, so that the target light intensity distribution is obtained when the target light quantity is achieved.

11. The method according to claim 10, further comprising determining an adjusting member to be driven of the plurality of adjusting members to obtain the target light intensity distribution.

12. The method according to claim 8, wherein detecting the total light quantity of an effective light source is based on an output value from a light quantity sensor inserted in the illumination optical system.

13. The method according to claim 8, wherein detecting the total light quantity is based on the light intensity distribution measured by the measuring device.

14. The method according to claim 8, wherein the measuring device is mounted on a substrate stage which holds a substrate.

* * * * *